United States Patent [19]

Dulin

[11] Patent Number: 4,500,936
[45] Date of Patent: Feb. 19, 1985

[54] FASTENER DRIVING DEVICE HAVING A THREE STAGE FIRING CIRCUIT

[75] Inventor: Kerry Dulin, Highland Park, Ill.

[73] Assignee: Textron, Inc., Providence, R.I.

[21] Appl. No.: 521,570

[22] Filed: Aug. 9, 1983

[51] Int. Cl.³ ............................................. H01H 47/32
[52] U.S. Cl. .................................... 361/152; 227/131
[58] Field of Search .............. 361/152, 153, 155, 156; 227/131; 307/252 UA

[56] References Cited

U.S. PATENT DOCUMENTS 3,215,864  11/1965  Doyle ............................. 307/252 Q
4,417,681  11/1983  Bernecki et al. .................. 227/131 X

OTHER PUBLICATIONS

G.E. Application Note Universal Motor Speed Controls—by F. W. Gutzwiller.
G.E. SCR Manual Fifth Edition 1972—pp. 202-203.

Primary Examiner—Reinhard J. Eisenzopf
Attorney, Agent, or Firm—Cushman, Darby & Cushman

[57] ABSTRACT

A fastener driving device such as a tacker, including a silicon-controlled rectifier (SCR) actuating circuit for producing a power stroke for substantially a complete half cycle of an AC potential supply and which occurs following the actuation of a switch actuable at random times with respect to the cycles of the AC supply. The circuit features three functional stages. A firing synchronizer circuit is provided to inhibit firing at other than the beginning or end of a half wave cycle of rectified AC potential. A memory supporting circuit provides a high degree of switch bounce immunity. A protecting circuit prevents an accidental and undesirable firing of the SCR that might otherwise automatically occur when a sudden increase of voltage occurs at its anode such as might occur when power is first applied to the actuating circuit.

31 Claims, 2 Drawing Figures

FASTENER DRIVING DEVICE HAVING A THREE STAGE FIRING CIRCUIT

BACKGROUND OF THE INVENTION

This invention relates in general to fastener driving devices, and more specifically, to control circuits for electrically operated fastener driving devices such as for example electric tackers.

An example of an electrically operated tacker is shown in the commonly assigned U.S. patent application of Bernecki et al, Ser. No. 294,422, filed Aug. 19, 1981, now U.S. Pat. No. 4,417,681. That teachings of that application are hereby incorporated by reference into this application.

In order to positively prevent unwanted double firing, it is appropriate to energize the tacker's solenoid for no more than a single one-half cycle of commercially available AC power. Various circuits are known and used for this purpose, such as, for example, U.S. Pat. No. 3,215,864—Doyle et al (Nov. 2, 1965), the teachings thereof being incorporated herein by reference. In the Doyle et al circuit, a unidirectional controlled conduction device, such as a silicon controlled rectifier (SCR) is used to close a power circuit so that current will flow in an electrical load such as the tacker's solenoid winding. Current flow through the solenoid winding causes a mechanical power stroke to be produced for effecting a tacking operation.

Known control circuits generate a gate signal for triggering the SCR on the first properly poled half cycle of an applied AC voltage after the randomly timed actuation of a switch by a user. The control circuit also includes means for preventing the application of a further gate signal to the SCR until the switch is released and then re-actuated by the user.

These known actuating circuits use various schemes for generating the gate signal for triggering the SCR to "fire" the solenoid. For example, in the Doyle U.S. Pat. No. 3,215,864, a charge is built up on a capacitor. When the switch is actuated this charge is used to generate the gate signal. This is a rather typical approach to generating the firing signal. Such known circuits are, however, susceptible to misfirings (unintended firings) and are generally not immune to switch bounce, i.e., proper firing is inhibited when the actuating switch does not make a clean firing closure but instead, its switch contacts bounce open and close again one or more times before remaining closed.

SUMMARY OF THE INVENTION

The present invention provides a fastener driving device featuring a three stage firing circuit for generating the firing signal. It includes a firing synchronizer for inhibiting firing at other than the beginning or end of a half wave rectified AC input power sinewave; a memory supporting circuit providing switch bounce immunity and a protection circuit for preventing undesirable firings that might occur with sudden voltage increases at the anode of a silicon controlled rectifier in the firing circuit.

The firing synchronizer allows the firing of a main SCR (SCR2) only at the beginning or end of a half wave rectified sinewave when the instantaneous voltage drops below 6 V. This is accomplished by turning on a transistor (TR) providing a shorting path for the SCR's gate when the line voltage is higher than 6 V.

The memory supporting circuit is, in essence, a feedback circuit for maintaining a firing signal on the SCR's gate even upon the occurrence of switch bounce. The memory supporting circuit includes a capacitor (C2) charged through a diode (D5) to activate an additional SCR (SCR1). The memory supporting circuit capacitor discharges through a resistor (R6) the gate of the additional SCR (SCR1) and an additional resistor (R10) for about 70 milliseconds. When the additional SCR (SCR1) is activated, it momentarily (about 0.2 milliseconds) discharges a main firing capacitor (C1) through a small valve resistor (R4). If the switch bounces thereby reducing the anode current of SCR1 to zero (which would normally turn off SCR1), the current from C2 keeps SCR1 turned on longer than the time it takes for C1 to be completely discharged.

The SCR protecting circuit includes a series resistor-capacitor circuit in parallel with the main firing SCR (SCR2) to prevent its accidental firing responsive to a fast rise of anode voltage.

BRIEF DESCRIPTION OF THE DRAWINGS

An exemplary embodiment of the present invention will be described in detail with reference to the drawings. The described embodiment is the presently contemplated best mode for carrying out the invention although it is to be considered a non-limitative example. In the drawings.

DETAILED DESCRIPTION OF THE PREFERRED EMBODIMENT

Figure 1:
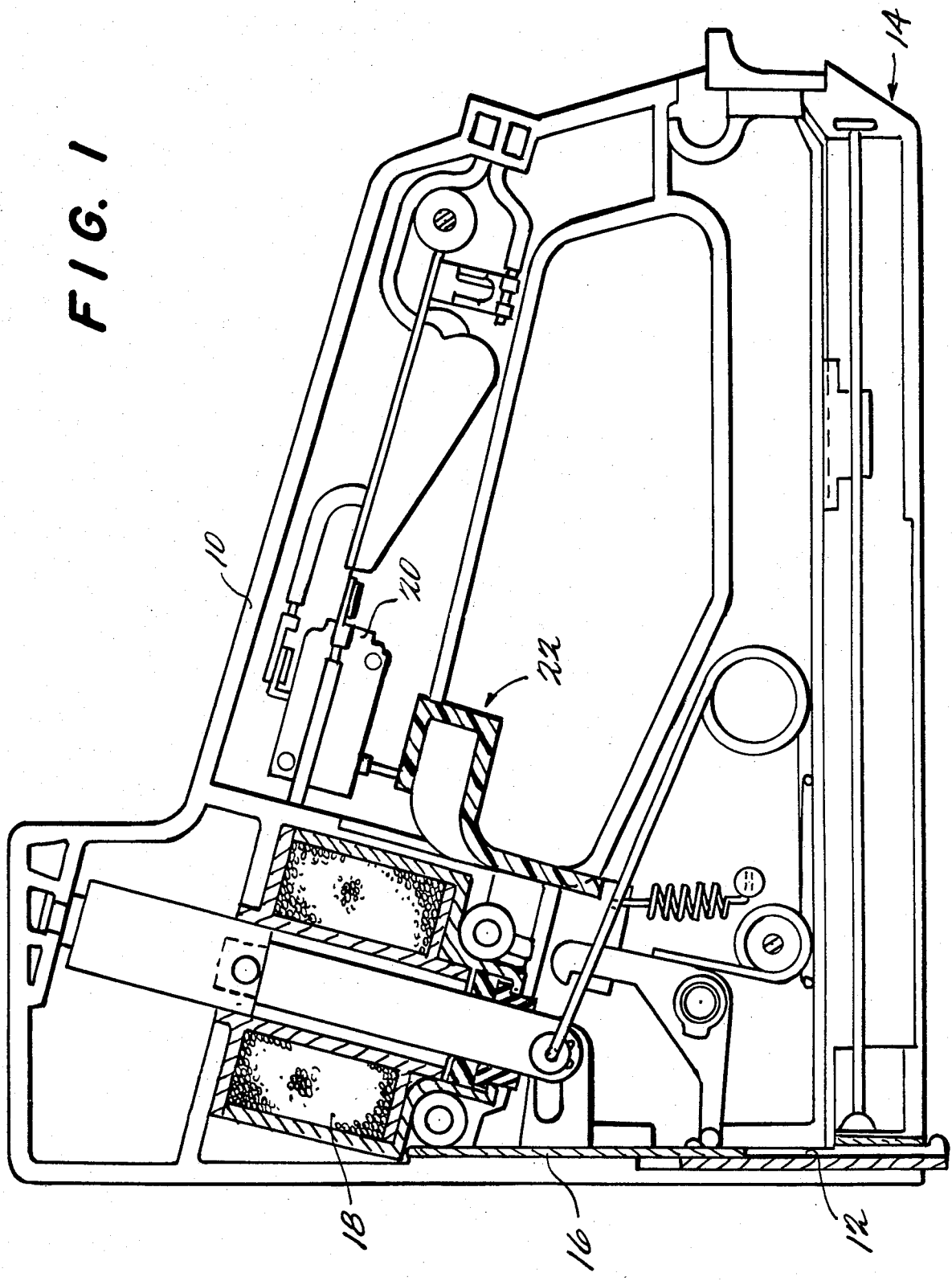
FIG. 1 is a vertical sectional view of a fastener driving device shown as an example of a device to which the present invention applies.

Referring now to FIG. 1 there is shown a vertical sectional view of an exemplary embodiment of a fastener driving device to which the present invention applies. The fastener driving device includes a housing 10 defining a drive track 12. A magazine 14 is provided for feeding fasteners to drive track 12 so that they can be driven one at a time by driver 16. Driver 16 is powered through a drive stroke in drive track 12 by power derived from a solenoid 18. To initiate a fastening operation, a user pulls on a trigger 22 which actuates an electrical contact switch 20. Switch 20 forms a part of an actuating circuit embodying the principles of the present invention since the invention is particularly concerned with the circuit and its function in connection with the basic components of the fastener driving device thus far described, the detailed construction of the basic components will not be described, it being understood that reference may be made to the aforesaid Bernecki et al application for any detailed understanding required.

Figure 2:
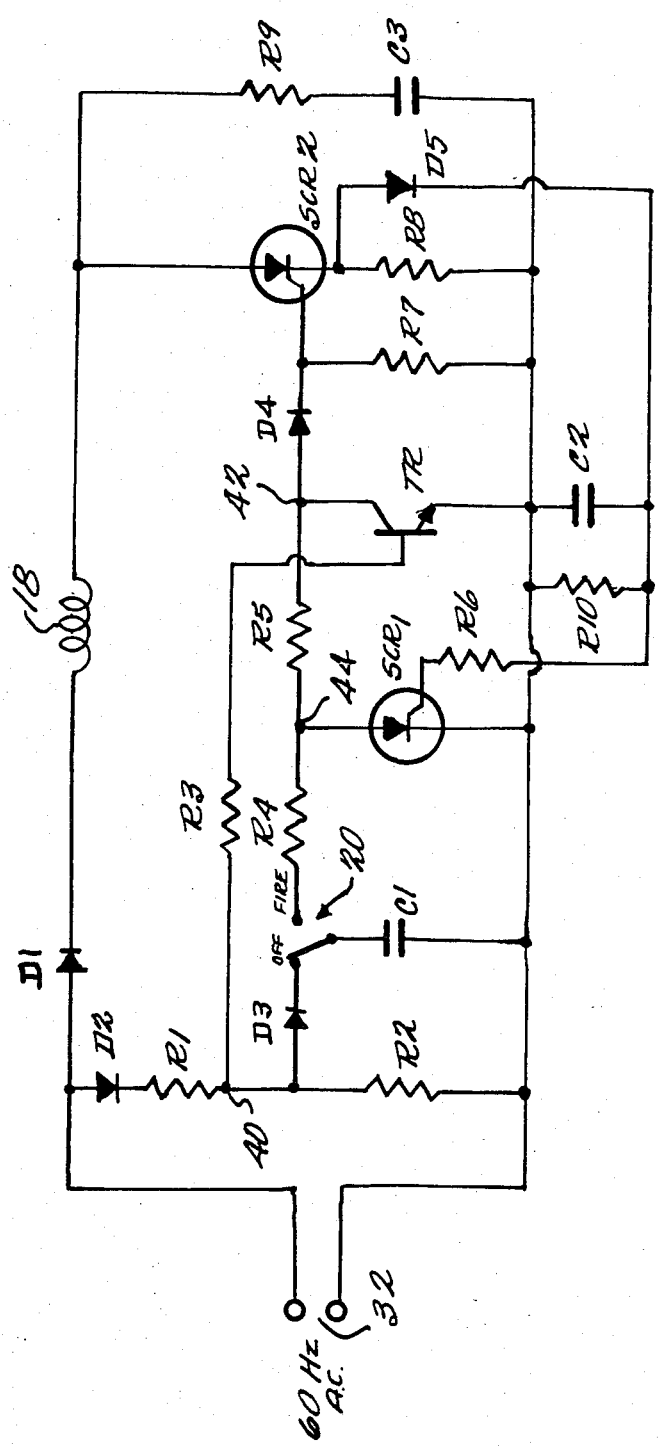
FIG. 2 is a schematic diagram of the actuating circuit according to the present invention.

Referring now to FIG. 2, there is shown a detailed schematic diagram of the actuating circuit according to the present invention. As previously stated, the circuit is intended to provide a firing signal to energize solenoid 18 over a single AC half wave for each actuation of a switch 20.

The heart of the actuating circuit is a series connection of a diode D1, solenoid 18, a silicon controlled rectifier SCR 2 constituting a controlled conduction device and resistor R8 across terminals 32 intended for coupling to a commercial AC line power mains. Whenever SCR 2 is fired, this circuit including solenoid 18 is completed and the solenoid is actuated to initiate a fastening operation. This occurs each time trigger 22 is actuated to move switch 20 from its "off" position to its "fire" position. The circuit is supplied by AC line voltage coupled to terminals 32. The voltage at terminals 32 is rectified by a diode D2 and then reduced in voltage by a voltage divider including resistors R1 and R2 to produce a voltage of about 16 volts peak. This voltage is applied to a capacitor C1 through a diode D3 when switch 20 is in its "off" position. Diode D3 prevents capacitor C1 from being discharged when the instantaneous voltage level at node 40 drops to zero.

From node 40 of the voltage divider, a "firing synchronizer" circuit is supplied. The firing synchronizer circuit includes a resistor R3 and a transistor TR. The firing synchronizer allows for the firing of SCR 2 only at the beginning or end of a half wave rectified sinewave when the instantaneous voltage drops below 6 volts. This function is achieved by turning transistor TR "on" to ground node 42 at the collector of the transistor when the line voltage is higher than 6 volts. Grounding node 42 prevents any voltage from being supplied to the gate of SCR 2 regardless of the position of switch 20.

When switch 20 is moved from the "off" to the "fire" position, the voltage on fully charged capacitor C1 is applied to the "fire" side of the switch. Voltage at node 44 is almost the same as that at the "fire" side of switch 20 because SCR 1 is "off" and resistor R4 is very small. The voltage at node 42 depends on the phase of rectified voltage. Assuming that switch S20 was moved to the "fire" position during a period between half sinewaves and the voltage at node 40 was zero. At this time, transistor TR in the firing synchronizer circuit is "off" and the voltage at the gate of SCR 2 is a function of the voltage on capacitor C1 divided by resistors R4, R5 and R7. This voltage is sufficient to fire SCR 2.

Whenever the voltage at the anode of SCR 2 reaches a sufficient level, then current begins to flow through SCR 2. After the rectified line voltage exceeds 6 volts, transistor TR turns on, thereby reducing the voltage at node 42 to the collector saturation level of the transistor. This is generally in the range of 0.1 to 0.3 volt. The voltage at the collector of transistor TR is additionally reduced by the forward voltage drop of a diode D4 having an anode coupled to the transistor's collector. The voltage from the collector of transistor TR is coupled via diode D4 to the gate of SCR 2. SCR 2 is already "on" and the gate voltage reduction caused by the grounding of node 42 does not affect its operation. Increasing the line voltage and current flowing through diode D1 and SCR 2 and solenoid 18 activates solenoid.

During the firing period of SCR 2 which is about 7–7½ milliseconds, a high current flows through resistor R8 and produces a voltage pulse at the cathode of SCR 2. This voltage pulse has a peak of about 4 volts and lasts for about 7 milliseconds. This voltage pulse is utilized by a memory supporting circuit to eliminate any possibility of switch bounce malfunction.

The memory supporting circuit includes a diode D5, capacitor C2, resistor R10, resistor R6 and SCR 1. The voltage at the cathode of SCR 2 charges capacitor C2 through diode D5 and activates SCR 1. Capacitor C2 discharges through resistor R6, the gate of SCR 1 and resistor R10 for about 70 milliseconds. When SCR 1 is activated, it momentarily discharges capacitor C1 through resistor R4. This takes approximately 0.2 milliseconds. If there are some contact bounces of switch 20 which temporarily reduce the anode current of SCR 1 to zero, then the gate current from discharging capacitor C2 keeps SCR 1 turned on longer than the time required for capacitor C1 to be completely discharged. This provides switch bounce immunity. Diode D5 prevents capacitor C2 from being rapidly discharged through the small value resistor R8. Resistor R10 discharges capacitor C2 after the voltage on the gate of SCR 1 drops below the gate turn on level.

Assume now that switch S20 was closed when a rectified line voltage was higher than 6 volts and was rising with rising slope of the half sinewave form. At that moment, transistor TR in the firing synchronizer is "on" and the potential at node 42 is low. This prevents the firing of SCR 2. Transistor TR1 is "on" until the rectified line voltage drops below 6 volts on the falling slope of the half sinewave form. After the voltage drops below 6 volts, transistor TR goes "off" thereby increasing the potential at node 42 and the gate of SCR 2 thereby activating SCR 2. Since the line voltage is only 6 volts and is still dropping, the current flowing through SCR 2 is very low and lasts only for a short period of time. This time period is about 0.3 milliseconds. This low current is not able to activate the solenoid or turn on SCR 1. During the time interval between two half sinewave forms, transistor TR is "off" and sufficient voltage is supplied to the gate of SCR 2 to turn it "on". The time constant of the circuit including capacitor C1 and resistors R4, R5 and R7 is selected such that sufficient voltage is supplied to the gate of SCR 2 to keep it "on" for about 30 milliseconds. After the line voltage starts rising, firing can take place as discussed above.

When the circuit is connected to AC line voltage via terminals 32 at a moment when the peak voltage is high, there will be a sudden increase in voltage at the anode of SCR 2. There is a high rate of change of voltage with respect to time at this point. This sudden change of voltage at the anode of SCR 2 might activate it. This would be an unintended actuation not caused by the switching of switch 20. To prevent this undesirable actuation, there is provided an SCR protecting circuit including resistor R9 and capacitor C3. The time constant of this circuit prevents the automatic and unintended actuation of SCR 2.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

I claim:

1. An electrically operated fastener driving device comprising:

a housing assembly defining a drive track;
    a driver movably engaged within said drive track;
    a magazine for feeding fasteners to said drive track for being driven by said driver;
    a solenoid energizable to move said driver through a drive stroke in said drive track;
    circuit means, including a first controlled conduction device having a control electrode, for conducting power from an AC potential source to said solenoid to energize it whenever a firing signal is applied to said control electrode;

switch means having a normally "off" position and operable in response to an actuation to move into a "fire" position at a random time relative to the cycles of the AC potential;

firing signal generating means for generating said firing signal in response to an actuation of said switch means from said "off" position to said "fire" position;

firing synchronizer circuit means for inhibiting the coupling of said firing signal to said control electrode until the magnitude of said AC potential is greater than a predetermined reference level; and switch bounce circuit means for preventing an interruption in the generation of said firing signal even if switch bounce occurs which might, in the absence of said switch bounce circuit means, cause an interruption of said firing signal.

2. A fastener driving device according to claim 1 wherein said first controlled conduction device is a silicon controlled rectifier (SCR).

3. A fastener driving device according to claim 1 wherein said firing signal generating means comprises:
charging circuit means for generating a charging voltage at said "off" position of said switch means;
a capacitor, coupled to said switch means so as to receive said charging voltage and be charged thereby when said switch means is in said "off" position;
a second controlled conduction device and a resistor in series circuit with the "fire" position of said switch for discharging said capacitor and generate a firing signal by a flow of capacitor discharging current through said resistor when said switch means is moved to said "fire" position.

4. A fastener driving device according to claim 3 wherein said firing synchronizer circuit comprises means for maintaining said actuating electrode of said first controlled conduction device at a sufficiently low voltage to prevent an onset of conduction of said first controlled conduction device until the AC potential rises above a predetermined magnitude.

5. A fastener driving device according to claim 4 wherein said maintaining means comprises a transistor switch for coupling said actuating electrode to said sufficiently low voltage whenever the magnitude AC potential is less than said predetermined magnitude.

6. A fastener driving device according to claim 3 wherein said switch bounce circuit means comprises:
means for generating a conductive signal whenever said first controlled conductive device conducts; and
time constant circuit means for applying, responsive to said conduction signal, a memory signal to said second controlled conduction device causing it to maintain conduction for a predetermined switch bounce immunity period even if a switch bounce temporarily breaks the circuit between said capacitor and "fire" position of said switch means that would otherwise cause said second controlled conduction device to stop conducting.

7. A fastener driving device according to claim 6 wherein said conduction signal generating means comprises a resistor coupled in series with said first controlled conduction device.

8. A fastener driving device according to claim 6 wherein said time constant circuit comprises an RC circuit coupled to said conductor signal generating means so as to be charged thereby and coupled to a control electrode of said second controlled conduction device for maintaining said second controlled conduction device in a conducting state even in the event of occurrence of switch bounce.

9. A fastener driving device according to claim 1 further comprising a protecting circuit including a resistor and a capacitor in parallel with said first controlled conduction device for preventing a sudden change in voltage at said second controlled conduction device from cause said device to become conductive in the absence of a firing signal applied to said actuating electrode.

10. An electrically operated fastener driving device comprising:
a housing assembly defining a drive track;
a driver movably engaged within said drive track;
a magazine for feeding fasteners to said drive track for being driven by said driver;
a solenoid for moving said driver through a drive stroke in said drive track;
circuit means, including a first controlled conduction device having a control electrode, for conducting power from an AC potential source to said solenoid to energize it whenever a firing signal is applied to said control electrode;
a switch, having a pole, an "off" throw position and a "fire" throw position, operable at a random times relative to the cycles of the AC potential source from said "off" position to said "on" position to actuate said fastener driving device;
a firing capacitor coupled to said switch pole;
a charging circuit for providing a charging voltage to said "off" throw for charging said capacitor when said switch is in said "off" position;
a firing circuit, including a second controlled conduction device, coupled to said "fire" throw of said switch for generating a firing signal when said switch is moved from said "off" position to said "fire" position by causing said second controlled conduction device to conduct;
means for detecting substantially the beginning of a half cycle of said AC potential;
means, responsive to said detecting means, for inhibiting said firing signal until substantially the beginning of a half cycle of said AC potential; and
means for maintaining conduction of said second controlled conduction device for a predetermined switch bounce interval after a contact between said pole and said "fire" throw of said switch.

11. A fastener driving device according to claim 10 wherein said first and second controlled conduction devices are silicon controlled rectifiers (SCRs).

12. A fastener driving device according to claim 10 wherein said charging circuit comprises a rectifier and voltage divider coupled to said AC potential source.

13. An actuating circuit according to claim 12 further comprising a protecting circuit including a resistor and a capacitor in parallel with said first controlled conduction device for preventing a sudden change in voltage at said second controlled conduction device from cause said device to become conductive in the absence of a firing signal applied to said actuating electrode.

14. A fastener driving device according to claim 10 wherein said firing circuit comprises a resistor and a second silicon controlled rectifier (SCR) in series with said capacitor, conduction of said second SCR causing a discharge of said capacitor through said resistor to generate said firing signal.

15. A fastener driving device according to claim 10 wherein said inhibiting means comprises a switching transistor coupled across said firing circuit for shorting said firing signal when said transistor is conductive.

16. A fastener driving device according to claim 10 wherein said maintaining means comprises:
- a first resistor in series with said first controlled conduction device;
- a diode having an anode coupled to a cathode of said first controlled conduction device;
- an RC circuit coupled to a cathode of said diode; and
- a second resistor coupling said RC circuit to a control electrode of said second controlled conduction device.

17. An actuating circuit for a tool comprising:
- winding means for operating said too;
- circuit means, including a controlled conduction device having a control electrode for conducting power from an AC potential source to said winding means whenever a firing signal is applied to said control electrode;
- switch means having a normally "off" position and a "fire" position operable at a random time relative to the cycles of the AC potential;
- firing signal generating means for generating said firing signal in response to an actuation of said switch means for said "off" position to said "fire" position;
- firing synchronizer circuit means for inhibiting the coupling of said firing signal to said control electrode until the magnitude of said AC potential is greater than a predetermined reference level; and
- switch bounce circuit means for preventing an interruption in the generation of said firing signal even if switch bounce occurs which might, in the absence of said switch bounce circuit means, cause an interruption of said firing signal.

18. An actuating circuit according to claim 17 wherein said first controlled conduction device is a silicon controlled rectifier (SCR).

19. An actuating circuit according to claim 17 wherein said firing signal generating means comprises:
- charging circuit means for generating a charging voltage at said "off" position of said switch means;
- a capacitor, coupled to said switch means so as to receive said charging voltage and be charged thereby when said switch means is in said "off" position;
- a second controlled conduction device and a resistor in series circuit with the "fire" position of said switch for discharging said capacitor and generate a firing signal by a flow of capacitor discharging current through said resistor when said switch means is moved to said "fire" position.

20. An actuating circuit according to claim 19 wherein said firing synchronizer circuit comprises means for maintaining said actuating electrode of said first controlled conduction device at a sufficiently low voltage to prevent an onset of conduction of said first controlled conduction device until the AC potential rises above a predetermined magnitude.

21. An actuating circuit according to claim 20 wherein said maintaining means comprises a transistor switch for coupling said actuating electrode to said sufficiently low voltage whenever the magnitude AC potential is less than said predetermined magnitude.

22. An actuating circuit according to claim 19 wherein said switch bounce circuit means comprises:
- means for generating a conductive signal whenever said first controlled conductive device conducts; and
- time constant circuit means for applying, responsive to said conduction signal, a memory signal to said second controlled conduction device causing it to maintain conduction for a predetermined switch bounce immunity period even if a switch bounce temporarily breaks the circuit between said capacitor and "fire" position of said switch means that would otherwise cause said second controlled conduction device to stop conducting.

23. An actuating circuit according to claim 22 wherein said conduction signal generating means comprises a resistor coupled in series with said first controlled conduction device.

24. An actuating circuit according to claim 22 wherein said time constant circuit comprises an RC circuit coupled to said conductor signal generating means so as to be charged thereby and coupled to a control electrode of said second controlled conduction device for maintaining said second controlled conduction device in a conducting state even in the event of occurrence of switch bounce.

25. An actuating circuit for a tool comprising:
- winding means for operating said tool;
- circuit means, including a controlled conduction device having a control electrode for conducting power from an AC potential source to said winding means whenever a firing signal is applied to said control electrode;
- switch means having a normally "off" position and a "fire" position operable at a random time relative to the cycles of the AC potential;
- a firing capacitor coupled to said switch pole;
- a charging circuit for providing a charging voltage to said "off" throw for charging said capacitor when said switch is in said "off" position;
- a firing circuit, including a second controlled conduction device, coupled to said "fire" throw of said switch for generating a firing signal when said switch is moved from said "off" position to said "fire" position by causing said second controlled conduction device to conduct;
- means for detecting substantially the beginning of a half cycle of said AC potential;
- means, responsive to said detecting means, for inhibiting said firing signal until substantially the beginning of a half cycle of said AC potential; and
- means for maintaining conduction of said second controlled conduction device for a predetermined switch bounce interval after a contact between said pole and said "fire" throw of said switch.

26. An actuating circut according to claim 25 wherein said first and second controlled conduction devices are silicon controlled rectifiers (SCRs).

27. An actuating circuit according to claim 25 wherein said charging circuit comprises a rectifier and voltage divider coupled to said AC potential source.

28. An actuating circuit according to claim 25 wherein said firing circuit comprises a resistor and a second silicon controlled rectifier (SCR) in series with said capacitor, conduction of said second SCR causing a discharge of said capacitor through said resistor to generate said firing signal.

29. An actuating circuit according to claim 25 wherein said inhibiting means comprises a switching transistor coupled across said firing circuit for shorting said firing signal when said transistor is conductive.

30. An actuating circuit according to claim 25 wherein said maintaining means comprises:
  a first resistor in series with said first controlled conduction device;
  a diode having an anode coupled to a cathode of said first controlled conduction device;
  an RC circuit coupled to a cathode of said diode; and
  a second resistor coupling said RC circuit to a control electrode of said second controlled conduction device.

31. An actuating circuit according to claim 25 wherein said winding means comprises a solenoid.

* * * * *